United States Patent [19]

Becker et al.

[11] Patent Number: 4,956,739

[45] Date of Patent: Sep. 11, 1990

[54] DEVICE FOR LOCATING INTERNAL FAULTS IN A HIGH-VOLTAGE CAPACITOR BATTERY

[75] Inventors: Michael Becker; Klaus Renz, both of Uttenreuth, Fed. Rep. of Germany

[73] Assignee: Siemens Aktiengesellschaft, Berlin and Munich, Fed. Rep. of Germany

[21] Appl. No.: 372,273

[22] Filed: Jun. 27, 1989

[30] Foreign Application Priority Data

Jun. 29, 1988 [DE] Fed. Rep. of Germany ....... 3821944

[51] Int. Cl.$^5$ .............................................. H02H 7/16
[52] U.S. Cl. ........................................ 361/16; 361/17; 361/85; 361/87
[58] Field of Search ...................... 361/15, 16, 17, 85, 361/86, 87

[56] References Cited

U.S. PATENT DOCUMENTS 3,984,734 10/1976 Becker .................................... 361/17

Primary Examiner—Derek S. Jennings
Attorney, Agent, or Firm—Kenyon & Kenyon

[57] ABSTRACT

A device to locate internal faults in a high-voltage capacitor battery that has a plurality of symmetrically parallel and series-coupled capacitor banks arranged in parallel branches coupled by shunt branches. The phase angles of the shunt currents flowing in the shunt branches relative to the total current flowing in the parallel branches are determined. A fault is located in one of the capacitor banks based upon these determined phase angles.

3 Claims, 2 Drawing Sheets

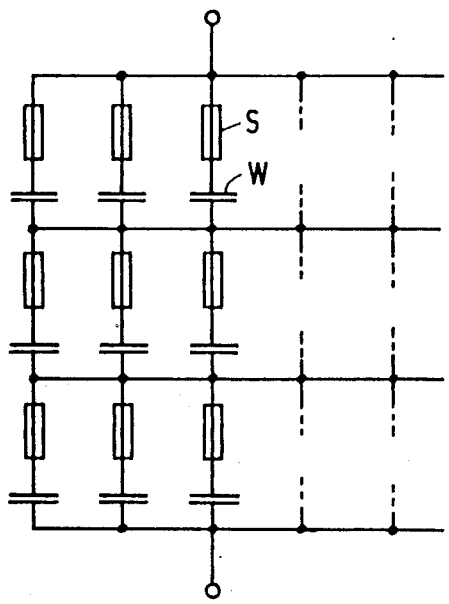
FIG 1
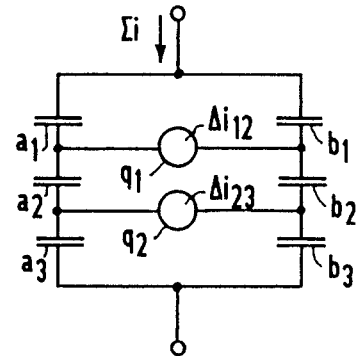
FIG 2
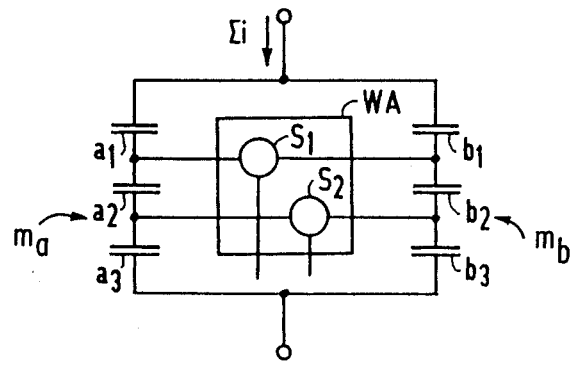
FIG 3
FIG 4

DEVICE FOR LOCATING INTERNAL FAULTS IN A HIGH-VOLTAGE CAPACITOR BATTERY

FIELD OF THE INVENTION

The invention relates to a device for locating internal faults in a high-voltage capacitor battery that has a plurality of symmetrically parallel and series-connected capacitor banks. Each capacitor bank is formed by a plurality of parallel and series-connected capacitor windings, each capacitor winding having an associated internal fuse.

BACKGROUND OF THE INVENTION

For various reasons, the use of high voltage capacitors with internal winding fuses is increasing. These high voltage capacitors are made up of "building blocks" or banks of capacitors and fuses. In these high voltage capacitors, it is impossible to determine faulty banks by visible inspection of the internal fuses. It is therefore important to ascertain the faulty state of the capacitor banks by electrical measurements. The equipment presently on the market is not satisfactory since it requires very time-consuming measurements of all the capacitors so that possible faults can be recognized. There is thus a need for a simple device by which a fault can be located with a reduction in the number of measurements needed to a fraction of the present number of required measurements.

SUMMARY OF THE INVENTION

This need for a device that locates a faulty capacitor bank in a high-voltage capacitor battery is met by the present invention which determines of the phase angles of currents flowing between parallel branches of the high-voltage capacitor battery relative to the total current flowing through the parallel branches. The determination that a particular capacitor bank is faulty is made from these phase angles.

The capacitor battery is divided into a multiple bridge circuit with shunt branches, and each shunt branch has an assigned shunt current transformer. The shunt current can be determined by the shunt current transformers.

In certain embodiments, the capacitor battery is divided such that adjacent shunt branches have an electric potential difference which permits the use of a single transformer with different secondary windings.

If the capacitor battery is divided into six equal parts in the form of a double-H bridge circuit and a fault has occurred only in one battery section, the measurements for the fault location according to the present invention can be carried out in one-sixth of the time previously required. The subdivision of the capacitor battery linearly increases the measuring sensitivity.

The equipment that evaluates the shunt currents and their phase angles must be sensitive enough such that every single fuse winding separation can be ascertained. For this purpose, automatic readjustment of the circuit takes place. As a result the steady-state change of the capacitance which can be measured by means of the fundamental of the current can be used in determining each subsequent separation. This then permits the individual separations per capacitor bank to be counted in order to obtain statistical statements.

BRIEF DESCRIPTION OF THE DRAWINGS

FIG. 1 is a circuit diagram of a capacitor bank.

FIG. 2 illustrates a subdivision of a capacitor battery into a double-H bridge circuit.

FIG. 3 is a look-up table for the phase angle of the shunt current relative to the total current.

FIG. 4 shows another embodiment of a device to measure the shunt currents of a capacitor battery, where the shunt current branches have approximately equal electric potentials.

DETAILED DESCRIPTION

FIG. 1 partially shows a single capacitor bank comprising a plurality of parallel and series-connected individual windings W, with a fuse S being assigned to each winding W. The entire capacitor battery shown in FIG. 2 is divided into six battery parts $a_1$, $a_2$, $a_3$, and $b_1$, $b_2$, $b_3$, respectively. Each one of these parts comprises a capacitor bank as shown in FIG. 1.

It must be determined in which part of the capacitor battery, which is configured in double-H circuit, that a fault has occurred. For this purpose, the shunt currents $\Delta i_{12}$ and $\Delta i_{23}$ between the parallel branches are determined by shunt current transformers q1 and q2 and their phases are compared with that of the total current $\epsilon i$. If there are no faults in the capacitor battery, the difference currents are either zero, are smaller than a predetermined value, or are compensated in the steady state in one of the evaluating circuits.

For a current flowing from the left capacitor side $a_1$, $a_2$, $a_3$ to the right capacitor side $b_1$, $b_2$, $b_3$, a positive phase angle is assumed. Therefore, a negative phase angle is present if the currents flow from $b_1$, $b_2$, $b_3$, to $a_1$, $a_2$, $a_3$. A fault correlation with a specific part of the capacitor battery is thereby obtained, depending on the phase angles of the individual shunt currents. For example, if the shunt current $\Delta i_{23}$ is positive and the shunt current $\Delta i_{23}$ is negative, the fault must be located in the battery section (capacitor bank) $a_2$. This is shown in the look-up table of FIG. 3.

In the embodiment of FIG. 4, the two shunt branches are approximately at the same electric potential, i.e., only a few capacitor banks in the central battery parts $m_a$ and $m_b$ are connected in series. This has the advantage that one transformer WA with two separate windings $S_1$, $S_2$ is sufficient for determining the phase angles of the shunt currents relative to the total current. Thereby, space for installation is saved.

Figure 5:
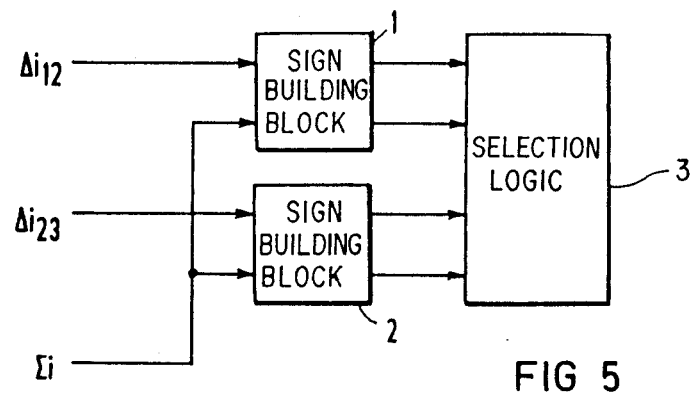
FIG. 5 illustrates a circuit arrangement for evaluating the signals in the circuit according to FIG. 2.

Referring to FIG. 5, the phase angles (+) or (−) of the shunt currents $\Delta i_{12}$ etc. relative to the total current $\epsilon i$ are determined in sign building blocks 1 and 2. From the logical output signals of these sign building blocks 1 and 2, it is determined by selection logic 3 in which battery part of the capacitor battery the fault is located. If the fault is determined, the circuit arrangement is automatically readjusted, using integrator 7, seen in FIG. 6, such that the fault is compensated for electrically and the system made ready for another fault detection.

Figure 6:
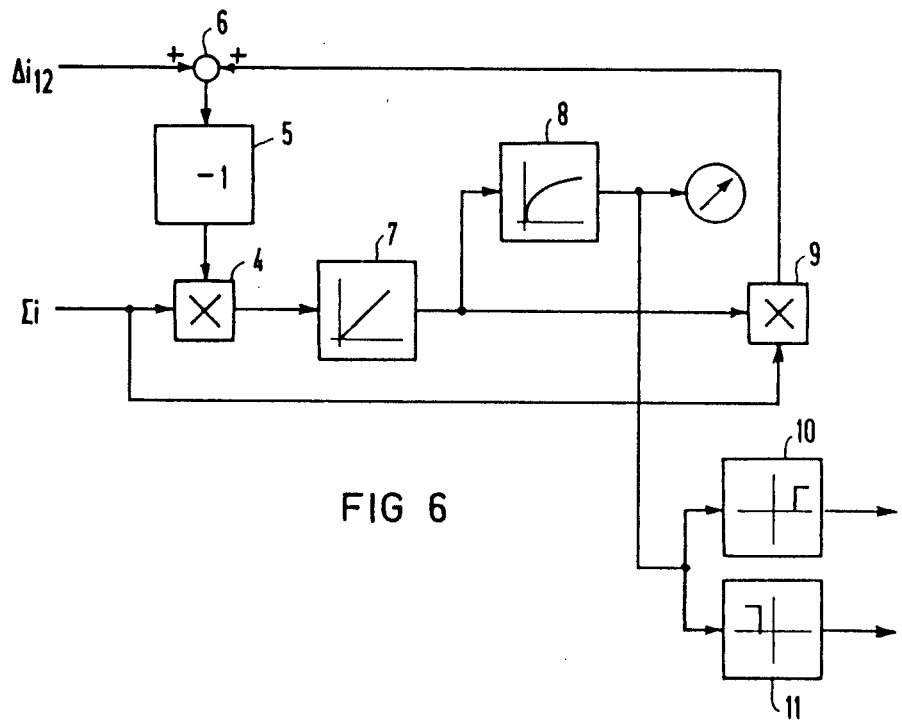
FIG. 6 shows in more detail the building block in FIG. 5 used to determine the phase angle of the shunt current relative to the total current.

As can be seen from FIG. 6, each sign building block 1 and 2 has two multipliers 4 and 9, and an integrator 7. The sum signal $\epsilon i$ is fed to a multiplier 4 and from there a multiplied signal is fed to multiplier 9 via the integrator 7. The sum signal $\epsilon i$ is also directly fed to the multiplier 9. The output signal of the multiplier 9 is added at a summing point 6 to a shunt current, for instance $\Delta i_{12}$. The sum is sent as a further input variable to the multiplier 4 via an inverting amplifier 5. The output of the integrator 7 will therefore be a signal carrying the sign (+) or (−) that is a measure for the phase angle of the current $\Delta i_{12}$ relative to the sum current $\epsilon i$. Such a circuit is described in further detail in German Patent Application DE-OS No. 29 30 034, herein incorporated by reference.

The signal from the integrator 7 is fed to a time delay stage 8 that suppresses transient interferences. The signal is then fed to two evaluation stages 10 and 11, at the output of which a plus or minus signal (±) is delivered which is then further processed in the logic circuit 3, according to a truth table like that shown in FIG. 3.

What is claimed:

1. A device for determining internal faults in a high-voltage capacitor battery that has a plurality of symmetrically parallel and series-coupled capacitor banks arranged in parallel branches coupled by shunt branches such that shunt currents flow between the parallel branches each of said capacitor banks having a plurality of parallel and series-coupled capacitor windings and associated internal fuses, comprising:
   means for determining phase angles of shunt currents flowing between parallel branches relative to a total current flowing through the parallel branches; and
   means for determining a faulty capacitor bank from said determined phase angles.

2. The device according to claim 1, wherein the capacitor battery is divided into a multiple bridge circuit and the means for determining the phase angles includes a shunt current transformer associated with each shunt branch.

3. The device according to claim 1, wherein the capacitor battery is divided such that adjacent shunt branches have an electric potential difference, and the means for determining the phase angles includes a common transformer with two secondary windings coupled to the adjacent shunt branches.

* * * * *